United States Patent
Moosburger et al.

(10) Patent No.: US 9,653,440 B2
(45) Date of Patent: May 16, 2017

(54) OPTOELECTRONIC COMPONENT WITH INTEGRATED PROTECTION DIODE AND METHOD OF PRODUCING SAME

(71) Applicant: OSRAM Opto Semiconductors GmbH, Regensburg (DE)

(72) Inventors: Jürgen Moosburger, Lappersdorf (DE); Lutz Höppel, Alteglofsheim (DE); Norwin von Malm, Nittendorf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/432,302

(22) PCT Filed: Oct. 8, 2013

(86) PCT No.: PCT/EP2013/070944
§ 371 (c)(1),
(2) Date: Mar. 30, 2015

(87) PCT Pub. No.: WO2014/056911
PCT Pub. Date: Apr. 17, 2014

(65) Prior Publication Data
US 2015/0294961 A1 Oct. 15, 2015

(30) Foreign Application Priority Data
Oct. 10, 2012 (DE) .................. 10 2012 218 457

(51) Int. Cl.
*H01L 33/00* (2010.01)
*H01L 21/00* (2006.01)
(Continued)

(52) U.S. Cl.
CPC ............ *H01L 25/167* (2013.01); *H01L 24/05* (2013.01); *H01L 24/13* (2013.01); *H01L 24/73* (2013.01);
(Continued)

(58) Field of Classification Search
CPC ....... H01L 2924/00014; H01L 2924/00; H01L 2924/12036; H01L 2924/12041;
(Continued)

(56) References Cited

U.S. PATENT DOCUMENTS 5,343,487 A * 8/1994 Scott .................. H01S 5/18333
372/45.01
6,184,582 B1 * 2/2001 Coult ................ H01L 23/49811
257/737
(Continued)

FOREIGN PATENT DOCUMENTS

DE 10 2007 062 046 A1 6/2009
DE 10 2009 051 129 A1 6/2011
(Continued)

OTHER PUBLICATIONS

English translation of the Notice of Reasons for Rejection dated Mar. 29, 2016 of corresponding Japanese Application No. 2015-536098.

*Primary Examiner* — Teresa M Arroyo
(74) *Attorney, Agent, or Firm* — DLA Piper LLP (US)

(57) ABSTRACT

An optoelectronic component includes an optoelectronic semiconductor chip having a first surface on which a first electrical contact and a second electrical contact are arranged, wherein the first surface adjoins a molded body, a first pin and a second pin are embedded in the molded body and electrically conductively connect to the first contact and the second contact, and a protection diode is embedded in
(Continued)

the molded body and electrically conductively connect to the first contact and the second contact.

9 Claims, 6 Drawing Sheets

(51) Int. Cl.
*H01L 25/16* (2006.01)
*H01L 33/62* (2010.01)
*H01L 29/861* (2006.01)
*H01L 33/54* (2010.01)
*H01L 33/56* (2010.01)
*H01L 23/31* (2006.01)
*H01L 21/56* (2006.01)
*H01L 23/00* (2006.01)
*H01L 21/683* (2006.01)

(52) U.S. Cl.
CPC ............ *H01L 24/92* (2013.01); *H01L 29/861* (2013.01); *H01L 33/54* (2013.01); *H01L 33/56* (2013.01); *H01L 33/62* (2013.01); H01L 21/561 (2013.01); H01L 21/568 (2013.01); H01L 21/6835 (2013.01); H01L 23/3157 (2013.01); H01L 24/03 (2013.01); H01L 24/11 (2013.01); H01L 24/29 (2013.01); H01L 24/32 (2013.01); H01L 24/83 (2013.01); H01L 24/94 (2013.01); H01L 2221/6835 (2013.01); H01L 2221/68381 (2013.01); H01L 2224/03002 (2013.01); H01L 2224/036 (2013.01); H01L 2224/0347 (2013.01); H01L 2224/03334 (2013.01); H01L 2224/03462 (2013.01); H01L 2224/0401 (2013.01); H01L 2224/04026 (2013.01); H01L 2224/05147 (2013.01); H01L 2224/05647 (2013.01); H01L 2224/11002 (2013.01); H01L 2224/1147 (2013.01); H01L 2224/11462 (2013.01); H01L 2224/13147 (2013.01); H01L 2224/291 (2013.01); H01L 2224/2929 (2013.01); H01L 2224/29339 (2013.01); H01L 2224/32145 (2013.01); H01L 2224/73203 (2013.01); H01L 2224/83005 (2013.01); H01L 2224/8384 (2013.01); H01L 2224/83801 (2013.01); H01L 2224/83851 (2013.01); H01L 2224/92 (2013.01); H01L 2224/9202 (2013.01); H01L 2224/92143 (2013.01); H01L 2224/94 (2013.01); H01L 2924/12036 (2013.01); H01L 2924/12041 (2013.01); H01L 2933/0033 (2013.01); H01L 2933/0066 (2013.01)

(58) Field of Classification Search
CPC ..... H01L 2924/00012; H01L 2924/014; H01L 2924/302; H01L 21/568; H01L 21/561; H01L 21/6835; H01L 2224/03; H01L 2224/94; H01L 2224/11; H01L 2224/83; H01L 2224/92; H01L 2224/9202; H01L 2224/03334; H01L 2224/03462; H01L 2224/05147; H01L 2224/05647; H01L 2224/11462; H01L 2224/13147; H01L 2224/291; H01L 2224/2929; H01L 2224/29339; H01L 2224/73203; H01L 2224/83801; H01L 2224/8384; H01L 2224/83851; H01L 2224/03002; H01L 2224/0347; H01L 2224/036; H01L 2224/0401; H01L 2224/04026; H01L 2224/11002; H01L 2224/1147; H01L 2224/32145; H01L 2224/83005; H01L 2224/92143; H01L 2221/6835; H01L 2221/68381; H01L 23/3157; H01L 23/60; H01L 24/03; H01L 24/05; H01L 24/11; H01L 24/13; H01L 24/29; H01L 24/32; H01L 24/73; H01L 24/83; H01L 24/92; H01L 24/94; H01L 25/167; H01L 2933/0033; H01L 2933/0066; H01L 29/861; H01L 33/54; H01L 33/56; H01L 33/62; H01L 33/36; H01L 33/52
USPC ...................................... 257/99, 777; 438/23
See application file for complete search history.

(56) References Cited

U.S. PATENT DOCUMENTS

| | | | | |
|---|---|---|---|---|
| 6,445,011 | B1* | 9/2002 | Hirano | H01L 33/385 257/676 |
| 6,573,537 | B1* | 6/2003 | Steigerwald | H01L 25/0753 257/103 |
| 6,605,828 | B1* | 8/2003 | Schwarzrock | G01D 5/34715 257/678 |
| 2005/0173713 | A1 | 8/2005 | Lin et al. | |
| 2006/0057751 | A1* | 3/2006 | Shen | H01L 25/167 438/22 |
| 2006/0166477 | A1 | 7/2006 | Wang et al. | |
| 2006/0243999 | A1 | 11/2006 | Shen | |
| 2007/0077673 | A1 | 4/2007 | Hwang et al. | |
| 2011/0220910 | A1 | 9/2011 | Kojima et al. | |
| 2011/0291148 | A1 | 12/2011 | Sugizaki et al. | |
| 2013/0234154 | A1 | 9/2013 | Kojima et al. | |
| 2013/0313592 | A1* | 11/2013 | Sugizaki | H01L 25/167 257/98 |
| 2015/0228634 | A1* | 8/2015 | Schug | H05B 33/083 257/88 |
| 2015/0349232 | A1* | 12/2015 | Lee | H01L 33/647 257/91 |

FOREIGN PATENT DOCUMENTS

| | | | | |
|---|---|---|---|---|
| JP | 2008-235792 | | 10/2008 | |
| JP | 2011-187679 | | 9/2011 | |
| JP | 2011-249502 | | 12/2011 | |
| JP | WO 2012086517 | A1 * | 6/2012 | ......... H01L 25/0753 |
| KR | 10-0769720 | B1 | 10/2007 | |
| WO | 2009/064330 | A2 | 5/2009 | |

* cited by examiner

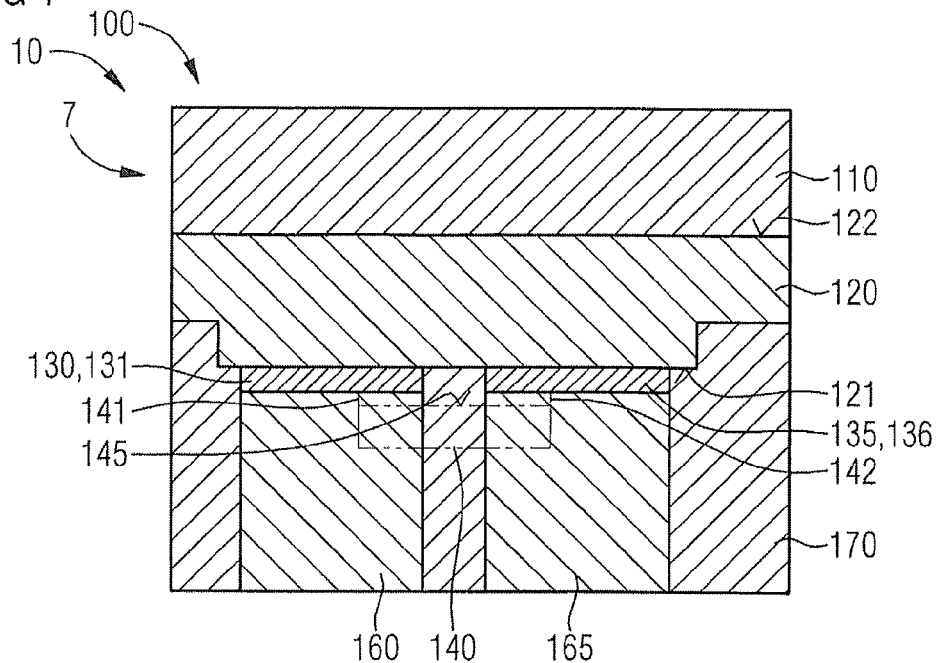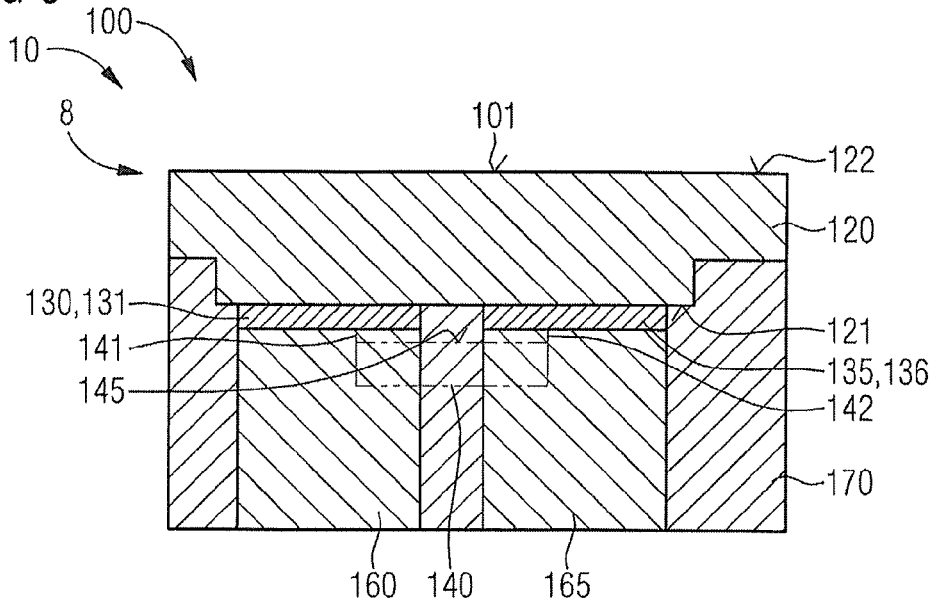

OPTOELECTRONIC COMPONENT WITH INTEGRATED PROTECTION DIODE AND METHOD OF PRODUCING SAME

TECHNICAL FIELD

This disclosure relates to an optoelectronic component and a method of producing an optoelectronic component.

BACKGROUND

Optoelectronic components having optoelectronic semiconductor chips are known in diverse variants. Optoelectronic semiconductor chips are known, the semiconductor layer structure of which is produced by epitactic growth is separated from a substrate after the epitactic growth. Such thin-film chips must be arranged on another carrier for mechanical stabilization before separation from the substrate. In addition, electrical terminal options must be provided for the electrical contacting of the chip. It is desirable to implement the carrier of the thin-film chip as compactly and cost-effectively as possible. In addition, an integration of additional components may be necessary.

It could therefore be helpful to provide an optoelectronic component and a method of producing an optoelectronic component.

SUMMARY

We provide an optoelectronic component including an optoelectronic semiconductor having a first surface on which a first electrical contact and a second electrical contact are arranged, wherein the first surface adjoins a molded body, a first pin and a second pin are embedded in the molded body and electrically conductively connect to the first contact and the second contact, and a protection diode is embedded in the molded body and electrically conductively connects to the first contact and the second contact.

We also provide a method of producing an optoelectronic component including providing an optoelectronic semiconductor chip having a first surface on which a first electrical contact and a second electrical contact are arranged, arranging a protection diode on the first contact and the second contact, galvanically growing a first pin on the first electrical contact and a second pin on the second electrical contact, and embedding the first pin, the second pin, and the protection diode in a molded body.

We further provide an optoelectronic component including an optoelectronic semiconductor chip having a first surface on which a first electrical contact and a second electrical contact are arranged, wherein the first surface adjoins a molded body, a first pin and a second pin are embedded in the molded body and electrically conductively connect to the first contact and the second contact, a protection diode is embedded in the molded body and electrically conductively connects to the first contact and the second contact, and the first pin and the second pin are galvanically grown.

BRIEF DESCRIPTION OF THE DRAWINGS

FIG. 7 shows the optoelectronic component in a seventh processing state.

FIG. 8 shows the optoelectronic component in an eighth processing state.

Figure 1:
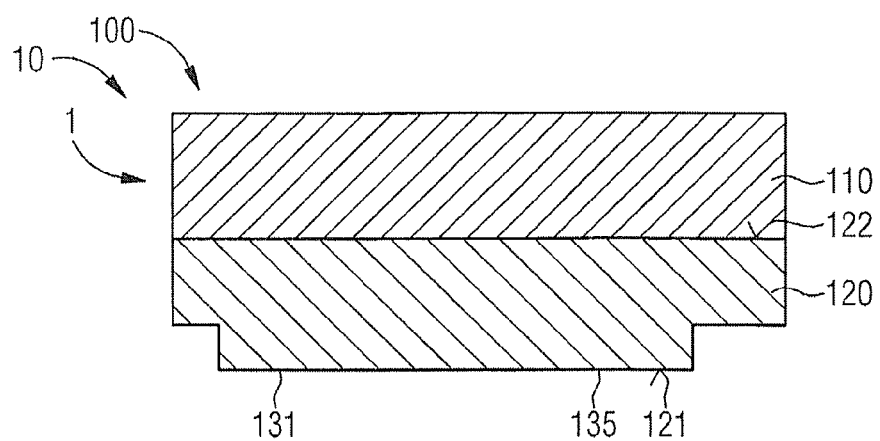
FIG. 1 shows an optoelectronic component in a first processing state.

LIST OF REFERENCE NUMERALS 1 first processing state
2 second processing state
3 third processing state
4 fourth processing state
5 fifth processing state
6 sixth processing state
7 seventh processing state
8 eighth processing state
10 optoelectronic component
20 optoelectronic component
100 semiconductor chip
101 emission side
110 substrate
120 epitaxial layer
121 rear side
122 front side
130 first contact (p)
131 first seed layer
135 second contact (n)
136 second seed layer
140 protection diode
141 first terminal
142 second terminal
145 terminal side
150 photoresist
151 web
152 opening
153 height
160 first pin
165 second pin
170 molded body
200 wafer composite

DETAILED DESCRIPTION

Our optoelectronic component comprises an optoelectronic semiconductor chip having a first surface, at which a first electrical contact and a second electrical contact are arranged. In this case, the first surface adjoins a molded body. A first pin and a second pin are embedded in the molded body and electrically conductively connect to the first contact and the second contact. In addition, a protection diode is embedded in the molded body and electrically conductively connects to the first contact and the second contact. The pins of this optoelectronic component are advantageously simultaneously used to electrically contact the optoelectronic semiconductor chip and as a chip carrier for the optoelectronic semiconductor chip. Electrical insulation of the pins and mechanical stabilization of the entire optoelectronic component is ensured by a molded body, which is obtainable cost-effectively. Due to the additional integrated protection diode, a necessity is advantageously dispensed with of providing the optoelectronic component with an external protection diode. By way of the integration of the protection diode, the optoelectronic component is additionally advantageously already protected from the point in time of the production of the optoelectronic component against damage due to electrostatic discharges.

The protection diode may have a first terminal and a second terminal. In this case, the first terminal and the second terminal of the protection diode face toward the first surface of the semiconductor chip. A direct electrical connection between the contacts of the optoelectronic semiconductor chip and the terminals of the protection diode can thus advantageously exist, whereby this electrical contact can be particularly reliable.

The protection diode may have a first terminal and a second terminal. In this case, the first terminal and the second terminal of the protection diode face away from the first surface of the semiconductor chip. A connection between the protection diode and the optoelectronic semiconductor chip thus advantageously does not need to be implemented as electrically conductive, whereby flexibility is increased during production of the optoelectronic component.

The first pin and the second pin may comprise copper. The first pin and the second pin thus advantageously have good electrical conductivity. In addition, the first pin and the second pin can then be produced easily and cost-effectively by galvanic growth.

The molded body may comprise a plastic. The molded body can thus advantageously be produced cost-effectively by a molding method.

The semiconductor chip may have a second surface opposite the first surface. In this case, the semiconductor chip is implemented to emit electromagnetic radiation through the second surface. Advantageously, in this optoelectronic component, no structures which obstruct the emission of the electromagnetic radiation have to be arranged on the second surface, whereby the optoelectronic component can have a high efficiency.

A method of producing an optoelectronic component comprises steps of providing an optoelectronic semiconductor chip having a first surface on which a first electrical contact and a second electrical contact are arranged, arranging a protection diode on the first contact and the second contact, galvanically growing a first pin on the first electrical contact and a second pin on the second electrical contact, and embedding the first pin, the second pin, and the protection diode in a molded body. In particular, the first and second electrical contacts are used as seed layers on which the first and second pin are each galvanically grown. An optoelectronic component having small dimensions is advantageously possible by way of this method. In particular, the optoelectronic component is a so-called "chip size package," the dimensions of which are essentially determined by the dimensions of the optoelectronic semiconductor chip. The optoelectronic semiconductor chip is advantageously non-housed, i.e., the optoelectronic semiconductor chip is not arranged inside a housing. The method can be carried out cost-effectively in this case. Due to integration of the protection diode already performed during production of the optoelectronic component, the optoelectronic component obtainable according to the method is protected from the beginning against unintentional damage due to electrostatic discharges.

An additional further step may be executed to separate a substrate of the semiconductor chip from an epitaxial layer of the semiconductor chip. The semiconductor chip is thus preferably implemented as a thin-film semiconductor chip. The substrate can subsequently advantageously be reused again, whereby the method can be carried out even more cost-effectively.

The protection diode may be arranged by gluing, sintering, or by soldering on the first contact and the second contact. The arrangement of the protection diode may thus be carried out automatically and cost-effectively.

The protection diode may be arranged so that electrical terminals of the protection diode face toward the first surface. An electrically conductive connection between the terminals of the protection diode and the contacts of the optoelectronic semiconductor chip can advantageously thus already be established during the arrangement of the protection diode on the first contact and the second contact, whereby this electrical connection can be made particularly reliable.

The protection diode may be arranged so that electrical terminals of the protection diode face away from the first surface. It is then advantageously not necessary during the arrangement of the protection diode on the contacts of the optoelectronic semiconductor chip to simultaneously establish an electrical connection between the terminals of the protection diode and the contacts of the optoelectronic semiconductor chip. In this way, the arrangement of the protection diode can be carried out even more simply and cost-effectively.

The protection diode may be at least partially embedded in the first pin and/or the second pin. The first pin and/or the second pin then advantageously causes an electrically conductive connection between the terminals of the protection diode and the contacts of the optoelectronic semiconductor chip. In addition, mechanical stability of the optoelectronic component produced according to the method is increased by embedding the protection diode in the first pin and/or the second pin.

Before galvanic growth, a photoresist may be arranged and structured on the first surface. In this case, the photoresist is removed after the galvanic growth. It can advantageously be ensured by the arrangement and structuring of the photoresist that the galvanic growth of the pins is performed at the desired positions and in a desired spatial direction.

The molded body may be created by a molding process. This method step can advantageously thus be carried out particularly cost-effectively.

The semiconductor chip may be provided in a wafer composite with at least one further semiconductor chip. In this case, the semiconductor chip is detached from the wafer composite after embedding the first pin, the second pin, and the protection diode in the molded body. The method can thus simultaneously advantageously be carried out and in parallel for a plurality of semiconductor chips, whereby the costs of carrying out the method per obtainable semiconductor chip can be substantially reduced.

The above-described properties, features, and advantages and the manner in which they are achieved will become clearly and unambiguously comprehensible in conjunction with the following description of the examples, which are explained in greater detail in conjunction with the drawings.

FIG. 1 shows a schematic sectional illustration of a still unfinished optoelectronic component 10 in a first processing state 1 during production of the optoelectronic component 10. The optoelectronic component 10 can be a light-emitting diode, for example.

The optoelectronic component 10 comprises a semiconductor chip 100. The semiconductor chip 100 can be an LED chip, for example. The semiconductor chip 100 comprises a substrate 110 and an epitaxial layer 120. The substrate 110 can comprise, for example, sapphire, SiC, Si, GaAs, or Ge. The epitaxial layer 120 has a layer sequence of different semiconductor layers, which were grown by epitaxial growth on the substrate 110. If the semiconductor chip is an LED chip, the epitaxial layer 120 thus has a light active layer comprising a pn-junction, which is implemented for the purpose of emitting electromagnetic radiation as soon as an electrical voltage is applied via the light-active layer of the epitaxial layer 120.

The epitaxial layer 120 has a rear side 121 and a front side 122. The front side 122 is arranged on one surface of the substrate 110. The rear side 121 of the epitaxial layer 120 is freely accessible. The rear side 121 can be provided with a mesa structuring and can have height differences as schematically shown in FIG. 1.

A first contact 130 and a second contact 135 are implemented on the rear side 121 of the epitaxial layer 120. The first contact 130 can, for example, electrically conductively connect to a p-doped region of the epitaxial layer 120. The second contact 135 then electrically conductively connects to an n-doped region of the epitaxial layer 120.

Figure 2:
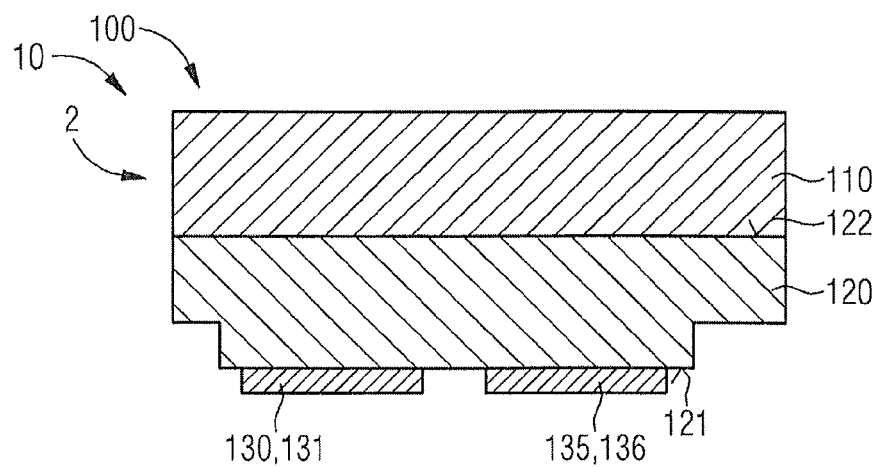
FIG. 2 shows the optoelectronic component in a second processing state.

FIG. 2 shows the optoelectronic component 10 in a second processing state 2 in a schematic sectional illustration. A first seed layer 131 was arranged in the region of the first contact 130 on the rear side 121 of the epitaxial layer 120 of the semiconductor chip 110. A second seed layer 136 was arranged in the region of the second contact 135 on the rear side 121 of the epitaxial layer 120 of the semiconductor chip 100. The first seed layer 131 and the second seed layer 136 comprise an electrically conductive material. For example, the first seed layer 131 and the second seed layer 136 can comprise copper. The seed layers 131, 136 can have been arranged, for example, by lamination on the rear side 121 of the epitaxial layer 120 of the semiconductor chip 100. However, the seed layers 131, 136 can also have been arranged, for example, by a photolithographic method on the rear side 121 of the epitaxial layer 120.

Figure 3:
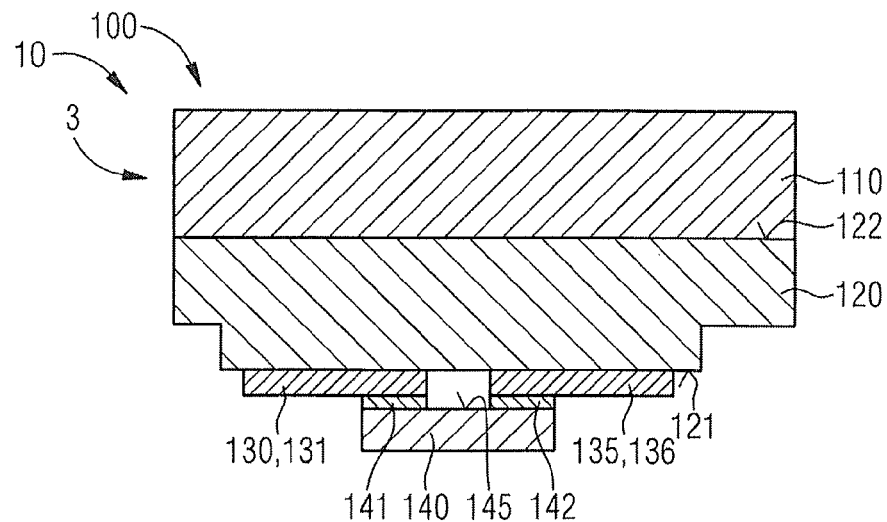
FIG. 3 shows the optoelectronic component in a third processing state.

FIG. 3 shows the optoelectronic component 10 in a schematic sectional illustration in a third processing state 3. A protection diode 140 has been arranged on the first seed layer 131 and the second seed layer 136 in the region of the first contact 130 and the second contact 135. The protection diode 140 is an ESD protection diode used to protect the optoelectronic component 10 from damage due to electrostatic discharges. The protection diode 140 is implemented as a surface-mountable SMT component (surface mount technology).

The protection diode 140 has a terminal side 145 having a first terminal 141 and a second terminal 142. The protection diode 140 is arranged on the first contact 130 and on the second contact 135 on the rear side 121 of the epitaxial layer 120 such that the terminal side 145 having the first terminal 141 and the second terminal 142 of the protection diode 140 faces toward the rear side 121 of the epitaxial layer 120.

The first terminal 141 of the protection diode 140 electrically conductively connects to the first seed layer 131 on the first contact 130 on the rear side 121 of the epitaxial layer 120. The second terminal 142 of the protection diode 140 electrically conductively connects to the second seed layer 136 on the second contact 135 of the epitaxial layer 120 of the semiconductor chip 100. The terminals 141, 142 of the protection diode 140 can be connected, for example, by silver conductive adhesive, silver sintering, or soldering to the seed layers 131, 136 on the rear side 121 of the epitaxial layer 120. The electrically conductive connections between the terminals 141, 142 of the protection diode 140 and the seed layers 131, 136 are thus simultaneously established and the mechanical fastening of the protection diode 140 on the semiconductor chip 100 is ensured.

Figure 4:
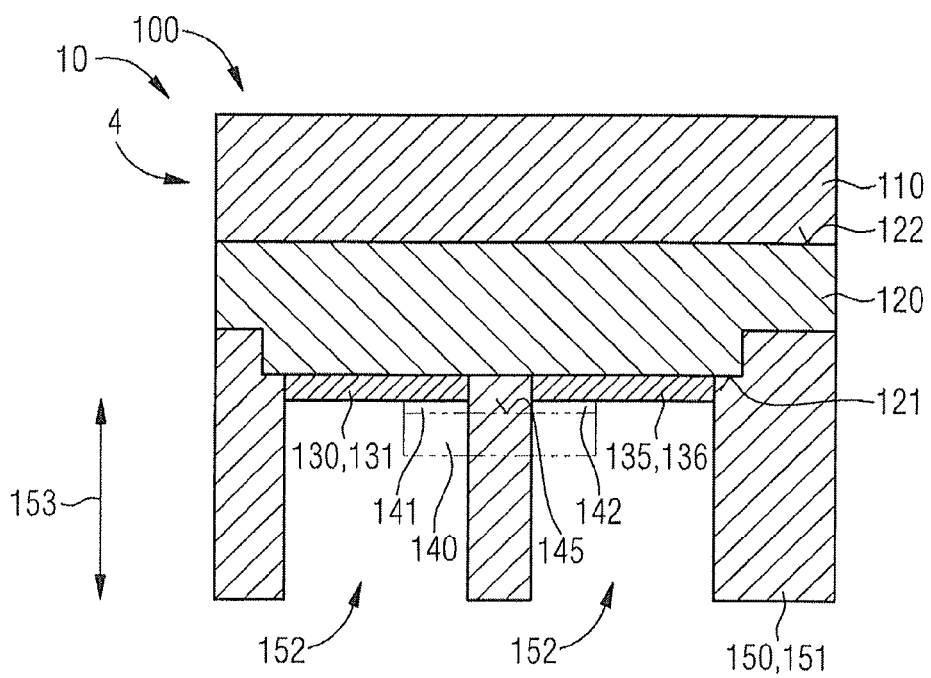
FIG. 4 shows the optoelectronic component in a fourth processing state.

FIG. 4 shows the optoelectronic component 10 in a schematic illustration in a fourth processing state 4. A photoresist 150 was applied and structured on the rear side 121 of the epitaxial layer 120 of the semiconductor chip 100. By way of the structuring of the photoresist 150, openings 152 have been formed in the photoresist 150, which are bounded by webs 151 of the layer made of photoresist 150 arranged on the rear side 121. An opening 152 is implemented in the region over the first seed layer 131 at the first contact 130. A further opening 152 is implemented in the region of the second seed layer 136 at the second contact 135. The photoresist 150 has a height 153 perpendicular to the surface of the rear side 121 of the epitaxial layer 120. The height 153 therefore also approximately corresponds to the depth of the openings 152.

Figure 5:
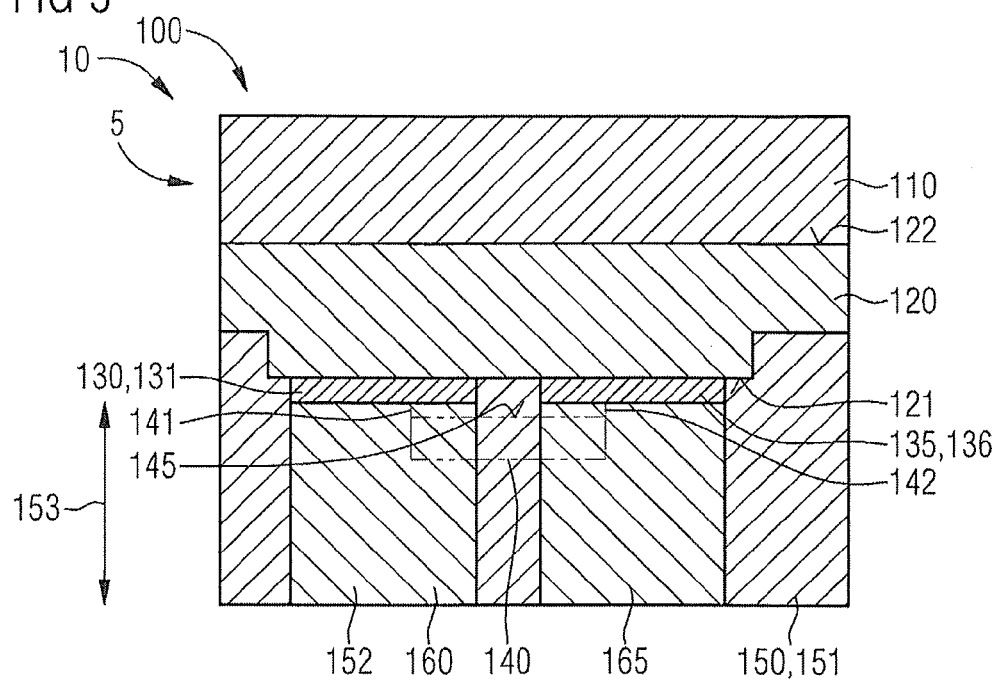
FIG. 5 shows the optoelectronic component in a fifth processing state.

FIG. 5 shows the optoelectronic component 10 in a schematic illustration in a fifth processing state 5. A first pin 160 and a second pin 165 were created by galvanic growth. The first pin 160 and the second pin 165 comprise an electrically conductive material, for example, copper. The first pin 160 and the second pin 165 can also be referred to as posts or platforms.

The galvanic growth of the first pin 160 originated from the first seed layer 131 on the first contact 130. The growth of the second pin 165 originated from the second seed layer 136 on the second contact 135. The openings 152 in the photoresist 150 were filled up by the first pin 160 and the second pin 165 by way of the growth of the first pin 160 and the second pin 165. The first pin 160 and the second pin 165 thus have a height which approximately corresponds to the height 153 of the openings 152 of the photoresist 150.

The first pin 160 electrically conductively connects to the first seed layer 131 and thus also to the first contact 130 of the semiconductor chip 100. The second pin 165 electrically conductively connects to the second seed layer 136 and thus also to the second contact 135 of the semiconductor chip 100.

During the galvanic growth of the first pin 160 and the second pin 165, the protection diode 160 arranged on the seed layers 131, 136 was partially embedded in the first pin 160 and the second pin 165. The arrangement of the protection diode 140 on the rear side 121 of the epitaxial layer 120 of the semiconductor chip 100 is thus additionally mechanically stabilized by the first pin 160 and the second pin 165.

Figure 6:
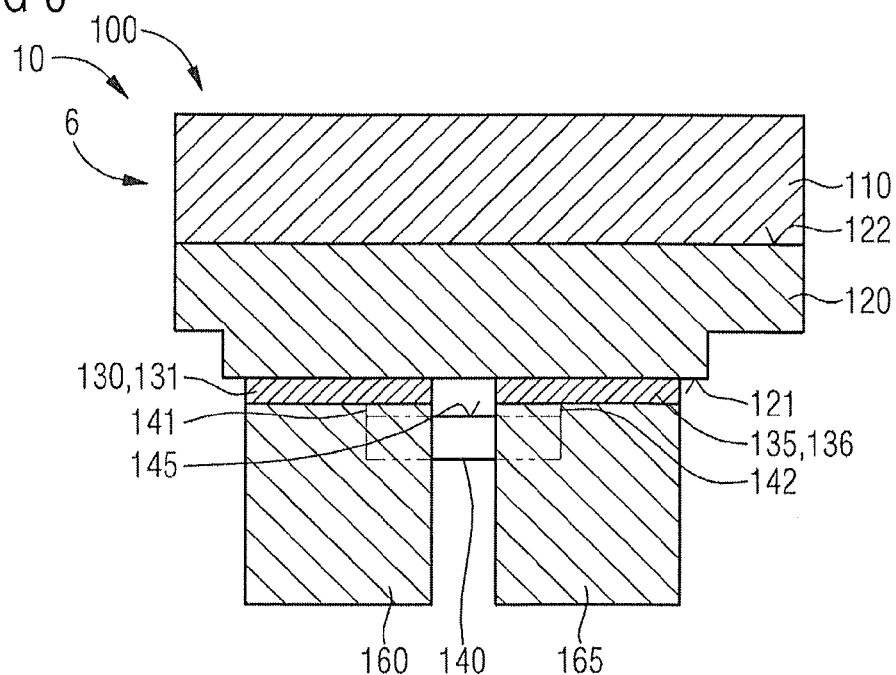
FIG. 6 shows the optoelectronic component in a sixth processing state.

FIG. 6 shows a schematic sectional illustration of the optoelectronic component 10 in a sixth processing state 6. In the sixth processing state 6, the photoresist 150 was removed from the rear side 121 of the epitaxial layer 120 of the semiconductor chip 100. The first pin 160 and the second pin 165 are therefore exposed in the sixth processing state 6 of the optoelectronic component 10.

FIG. 7 shows a schematic sectional illustration of the optoelectronic component 10 in a seventh processing state 7. A molded body 170 was implemented on the rear side 121 of the epitaxial layer 120 of the semiconductor chip 100. The molded body 170 comprises an electrically insulating material. For example, the molded body 170 can comprise a plastic, for example, an epoxy resin. A filling material can be admixed to adapt the thermal coefficient of expansion of the molded body 170. The molded body 170 can have been produced, for example, by injection molding or a molding process.

The first pin 160, the second pin 165, and the protection diode 140 are embedded in the molded body 170. In this way, the arrangement made of the semiconductor chip 100, the first pin 160, the second pin 165, and the protection diode 140 is mechanically stabilized. A surface of the molded body 170 facing away from the epitaxial layer 120 terminates flush with the longitudinal ends of the pins 160, 165 facing away from the epitaxial layer 120. The pins 160, 165 are externally accessible on this surface of the molded body 170.

Before or after production of the molded body 170, a method step for planarization of the rear side 121 of the epitaxial layer 120 can also be performed. Planarization can be performed in this case, for example, using benzocyclobutene (BCB). After production of the molded body 170, the pins 160, 165 can be exposed and planarized, for example, by grinding and polishing.

FIG. 8 shows a schematic sectional illustration of the optoelectronic component 10 in an eighth processing state 8. In relation to the seventh processing state 7 of the optoelectronic component 10, the substrate 110 of the semiconductor chip 100 was detached from the epitaxial layer 120 of the semiconductor chip 100. The detachment of the substrate 110 can have been performed, for example, by a laser lift-off method.

The front side 122 of the epitaxial layer 120 of the semiconductor chip 100 is now exposed by removal of the substrate 110. The front side 122 of the epitaxial layer 120 forms an emission side 101 of the semiconductor chip 100 of the optoelectronic component 10, through which light can be emitted from the epitaxial layer 120. If an electrical voltage is applied to a pn-junction of the epitaxial layer 120 via the first pin 160 and the second pin 165, electromagnetic radiation, for example, visible light, is thus generated in the epitaxial layer 120, which is emitted through the emission side 101 on the front side 122 of the epitaxial layer 120.

The substrate 110 detached from the epitaxial layer 120 of the semiconductor chip 100 can subsequently be reused. For this purpose, a new epitaxial layer 120 is applied to the substrate 110 by epitactic growth. The further processing then begins again in the first processing state 1 illustrated in FIG. 1.

The optoelectronic component 10 can, proceeding from the eighth processing state 8, optionally also be provided with a conversion layer used to convert a wavelength of electromagnetic radiation emitted on the emission side 101 of the semiconductor chip 100. For this purpose, the conversion layer is arranged on the front side 121 of the epitaxial layer 120.

Figure 9:
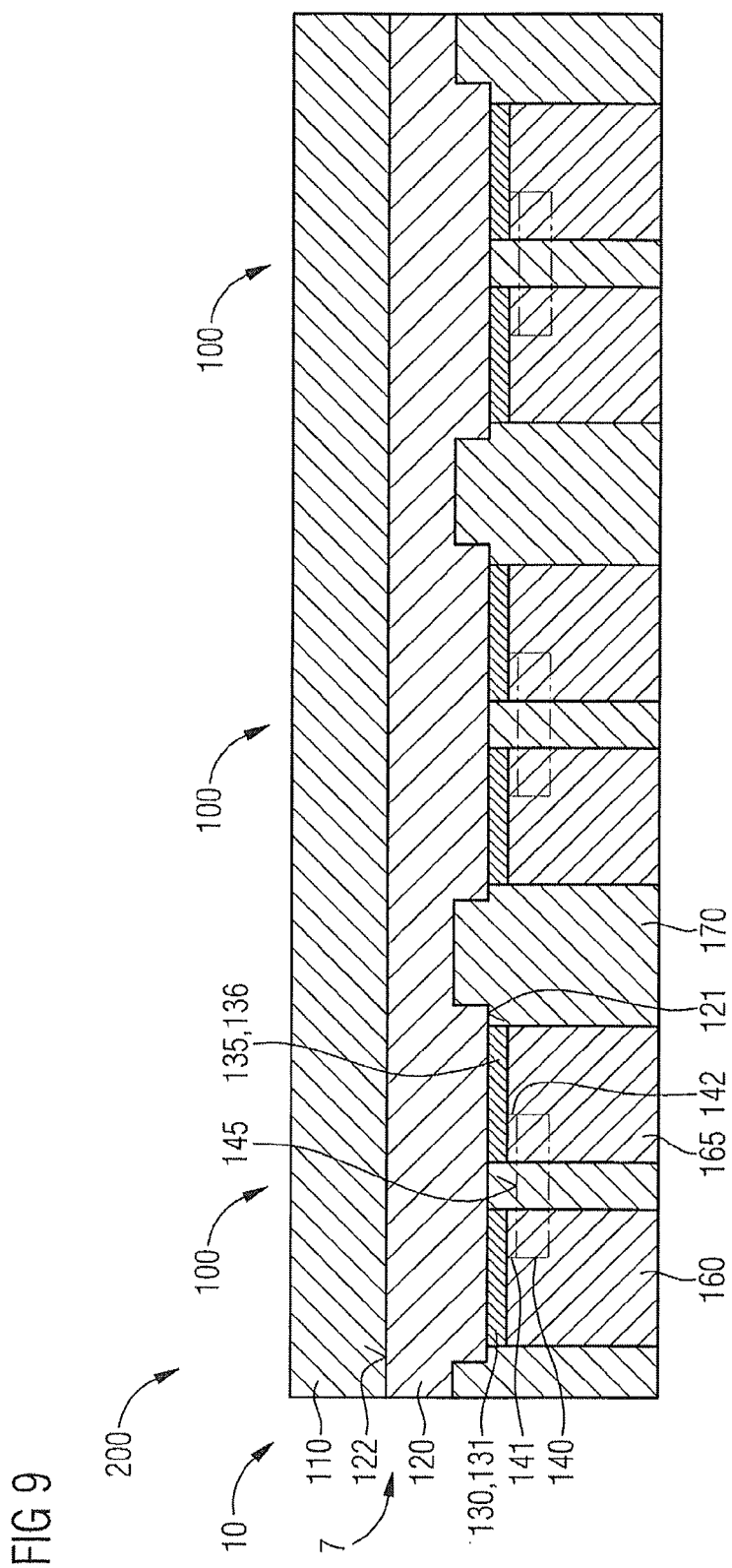
FIG. 9 shows the optoelectronic component in a wafer composite.

FIG. 9 shows a further schematic sectional illustration of the optoelectronic component 10 in the seventh processing state 7. In the illustration of FIG. 9, the semiconductor chip 100 is arranged in a wafer composite 200 with a plurality of further semiconductor chips 100. In the illustration of FIG. 9, the wafer composite 200 comprises three semiconductor chips 100. However, the wafer composite 200 can also comprise a substantially larger number of essentially identical semiconductor chips 100. The semiconductor chips 100 can be arranged in a two-dimensional matrix.

The substrate 110 of the semiconductor chip 100 is implemented as a one-piece substrate wafer in the wafer composite 200. The epitaxial layers 120 of all semiconductor chips 100 were grown simultaneously as a common epitaxial layer on this substrate wafer. The first seed layers 131 and the second seed layers 136 of all semiconductor chips 100 were applied in a common work step. Subsequently, protection diodes 140 were arranged on the seed layers 131, 136 of all contacts 130, 135 of all semiconductor chips 100. The galvanic growth of the pins 160, 165 is also simultaneously performed in parallel for all semiconductor chips 100. Subsequently, the pins 160, 165 and the protection diodes 140 of all semiconductor chips 100 were simultaneously embedded in a common molded body 170.

In a further processing step, the substrate wafer of the wafer composite 200 can now also be detached. Subsequently, the semiconductor chips 100 are separated from one another to obtain a plurality of optoelectronic components 10. The production costs of producing the optoelectronic components 10 are substantially decreased by the parallel production of the optoelectronic components 10 in the wafer composite 200.

Figure 10:
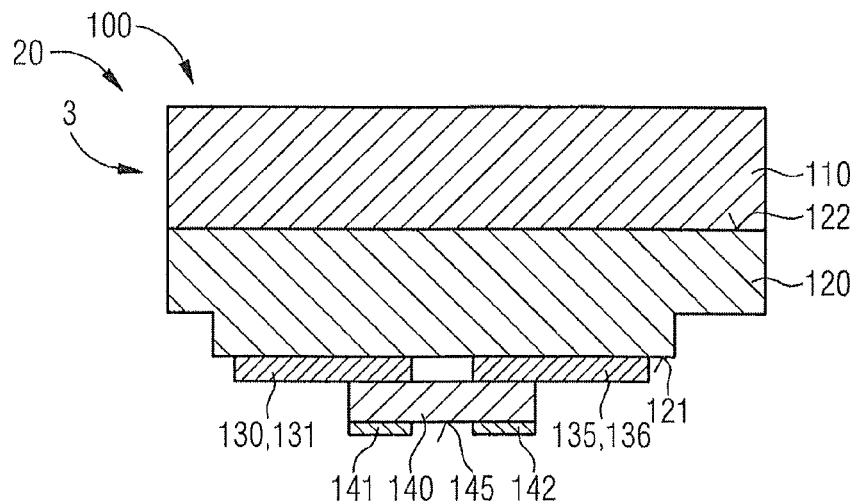
FIG. 10 shows an optoelectronic component according to a second example in the third processing state.

FIG. 10 shows a schematic sectional illustration of an optoelectronic component 20 according to a second example in an unfinished processing state. The optoelectronic component 20 has large correspondences to the optoelectronic component 10. Components corresponding to one another are therefore provided with the same reference signs in both components 10, 20 and will not be described again in detail hereafter.

Production of the optoelectronic component 20 also runs similarly to production of the optoelectronic component 10. FIG. 10 shows the optoelectronic component 20 in the third processing state 3. The processing steps performed up to the third processing state 3 correspond to those during the production of the optoelectronic component 10 up to its third processing state 3.

In contrast to production of the optoelectronic component 10, during production of the optoelectronic component 20, the protection diode 140 was arranged on the seed layers 131, 136 on the contacts 130, 135 on the rear side 121 of the epitaxial layer 120 of the semiconductor chip 100 such that the terminal side 145 having the first terminal 141 and the second terminal 142 of the protection diode 140 faces away from the rear side 121 of the epitaxial layer 120. The protection diode 140 was fastened by gluing, sintering, or soldering to the seed layers 131, 136 of the semiconductor chip 100. Gluing can have been performed in this case, for example, by a silver conductive adhesive or another adhesive. Sintering can have been performed, for example, as silver sintering.

Due to the fastening of the protection diode 140 on the seed layers 131, 136 of the semiconductor chip 100, however, only a mechanical connection was provided between the protection diode 140 and the semiconductor chip 100. No electrically conductive connection was created between the terminals 141, 142 of the protection diode 140 and the seed layers 131, 136 or the contacts 130, 135 of the epitaxial layer 120 of the semiconductor chip 100. Due to the lack of a necessity of providing an electrically conductive connection between the terminals 141, 142 of the protection diode 140 and the seed layers 131, 136 of the semiconductor chip 100, a broad selection of fastening options is available to fasten the protection diode 140 on the semiconductor chip 100.

Figure 11:
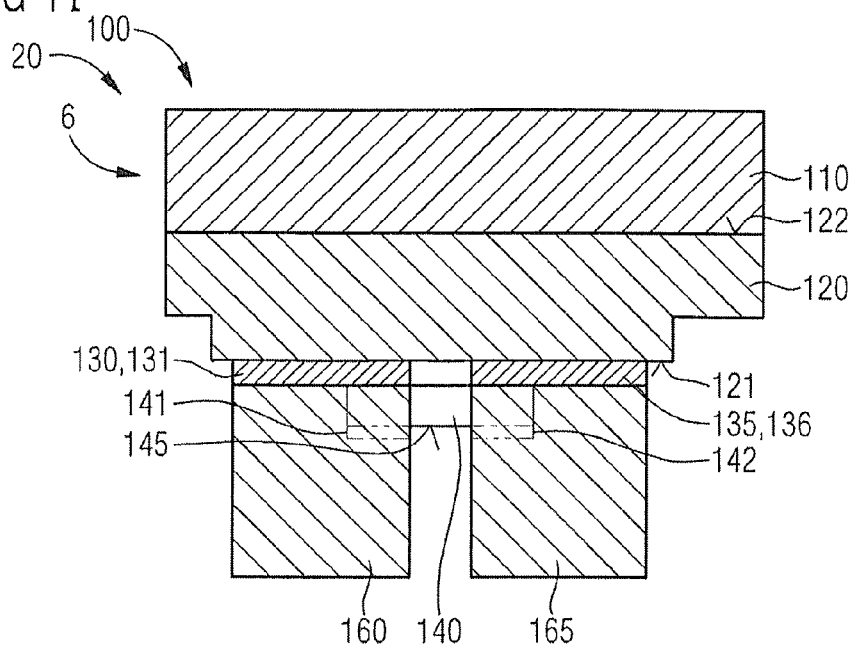
FIG. 11 shows the optoelectronic component according to a second example in the sixth processing state.

FIG. 11 shows the optoelectronic component 20 in a schematic sectional illustration in the sixth processing state 6. The processing steps performed between the third processing state 3 shown in FIG. 10 and the sixth processing state 6 illustrated in FIG. 11 correspond to the processing steps during production of the optoelectronic component 10 between the third processing state 3 illustrated in FIG. 3 and the sixth processing state 6 illustrated in FIG. 6.

During the processing steps preceding the sixth processing state 6, a first pin 160 was created on the first seed layer 131 on the first contact 130 of the epitaxial layer 120 of the semiconductor chip 100 and a second pin 165 was created on the second seed layer 136 on the second contact 135 of the epitaxial layer 120 of the semiconductor chip 100. During the galvanic growth of the pins 160, 165, the protection diode 140 was partially embedded in the first pin 160 and the second pin 165. In this case, the first terminal 141 of the protection diode 140 was embedded in the first pin 160. The second terminal 142 of the protection diode 140 was embedded in the second pin 165. In this way, an electrically conductive connection resulted between the first pin 160 and the first terminal 141 of the protection diode 140. In addition, an electrically conductive connection resulted between the second pin 165 and the second terminal 142 of the protection diode 140. Since the first pin 160 also electrically conductively connects to the first seed layer 131 and thus also to the first contact 130 of the semiconductor chip 100, there is now also an electrically conductive connection between the first terminal 141 of the protection diode 140 and the first contact 130 on the epitaxial layer 120 of the semiconductor chip 100. Correspondingly, there is also an electrically conductive connection between the second terminal 142 of the protection diode 140 and the second contact 135 of the epitaxial layer 120 of the semiconductor chip 100.

The further processing steps to complete the optoelectronic component 20 correspond to the further processing steps of producing the optoelectronic component 10. The optoelectronic component 20 can also preferably be produced in parallel with a plurality of further optoelectronic components 20 in a wafer composite.

Our methods and components are illustrated and described in greater detail on the basis of the preferred examples. Nonetheless, this disclosure is not restricted to the disclosed examples. Rather, other variations can be derived therefrom by those skilled in the art, without leaving the scope of protection of this disclosure as defined in the appended claims.

The invention claimed is:

1. An optoelectronic component comprising:
an optoelectronic semiconductor chip having a first surface on which a first electrical contact and a second electrical contact are arranged, wherein the first surface adjoins a molded body;
a first pin and a second pin that are galvanically grown, embedded in the molded body and electrically conductively connect to the first contact and the second contact; and
a protection diode is embedded in the molded body and electrically conductively connects to the first contact and the second contact, and the protection diode is at least partially embedded in the first pin and the second pin.

2. The optoelectronic component according to claim 1, wherein the protection diode has a first terminal and a second terminal, and the first terminal and the second terminal face toward the first surface of the semiconductor chip.

3. The optoelectronic component according to claim 1, wherein the protection diode has a first terminal and a second terminal, and the first terminal and the second terminal face away from the first surface of the semiconductor chip.

4. The optoelectronic component according to claim 1, wherein the first pin and the second pin comprise copper.

5. The optoelectronic component according to claim 1, wherein the molded body comprises a plastic.

6. The optoelectronic component according to claim 1, wherein the semiconductor chip has a second surface opposite to the first surface, and the semiconductor chip emits electromagnetic radiation through the second surface.

7. The optoelectronic component according to claim 1, wherein the first pin and the second pin serve as a chip carrier for the optoelectronic semiconductor chip.

8. The optoelectronic component according to claim 1, wherein the first and second pins terminate flush with the molded body on a side of the first and second pins facing away from the semiconductor chip.

9. An optoelectronic component comprising:
an optoelectronic semiconductor chip having a first surface on which a first electrical contact and a second electrical contact are arranged, wherein the first surface adjoins a molded body;
a first pin and a second pin are embedded in the molded body and electrically conductively connect to the first contact and the second contact; and
a protection diode is embedded in the first pin, the second pin and the molded body, and electrically conductively connects to the first contact and the second contact.

* * * * *